United States Patent [19]

Yamada

[11] Patent Number: 5,238,874
[45] Date of Patent: Aug. 24, 1993

[54] FABRICATION METHOD FOR LAMINATED FILMS COMPRISING AL-SI-CO ALLOY FILM AND REFRACTORY METAL SILIOIDE COPPER FILM

[75] Inventor: Yoshiaki Yamada, Tokyo, Japan

[73] Assignee: NEC Corporation, Tokyo, Japan

[21] Appl. No.: 611,741

[22] Filed: Nov. 9, 1990

[30] Foreign Application Priority Data

Nov. 9, 1989 [JP] Japan ................... 1-292729

[51] Int. Cl.⁵ ......................................... H01L 21/28
[52] U.S. Cl. ................... 437/1.98; 437/199; 437/200; 437/189; 437/192; 437/194; 148/DIG. 147
[58] Field of Search ............ 437/198, 199, 192, 194, 437/200, 189; 148/DIG. 147

[56] References Cited

U.S. PATENT DOCUMENTS

| | | | |
|---|---|---|---|
| 4,443,930 | 4/1984 | Hwang et al. | 437/200 |
| 4,495,221 | 1/1985 | Broadbent | 437/198 |
| 4,742,014 | 5/1988 | Hooper et al. | 437/192 |

FOREIGN PATENT DOCUMENTS

| | | | |
|---|---|---|---|
| 0119497 | 9/1984 | European Pat. Off. | 437/199 |
| 0034647 | 2/1984 | Japan | 437/199 |
| 0261847 | 10/1989 | Japan | 437/199 |

OTHER PUBLICATIONS

T. Fjuii et al., "Comparison of Electromigration Phenomenon Between Aluminum Inter-Connection of Various Multilayered Materials", *VMIC Conference*, Jun. 12-13, 1989, pp. 477–483.

*Primary Examiner*—Mary Wilczewski
*Attorney, Agent, or Firm*—Burns, Doane, Swecker & Mathis

[57] ABSTRACT

As a wiring for semiconductor devices, the wiring consisting of an Al-Si-Cu alloy film is excellent in the electromigration resistance but is inferior in the stressmigration resistance. In order to compensate this aspect a laminated film consisting of an Al-Si-Cu alloy film and a refractory metal silicide film began to be used as the wiring, but a wiring thus obtained has a weakness in that its electromigration resistance deteriorates. However, it is possible to suppress the deterioration in the electromigration resistance while maintaining the stressmigration resistance by adding Cu to the refractory metal silicide film. In particular, when the refractory metal silicide film is a tungsten silicide film, the concentration of Cu is preferable that it is in the range of 0.1 to 1.0 wt. %.

4 Claims, 6 Drawing Sheets

FABRICATION METHOD FOR LAMINATED FILMS COMPRISING AL-SI-CO ALLOY FILM AND REFRACTORY METAL SILIOIDE COPPER FILM

BACKGROUND OF THE INVENTION

1. Field of the Invention

The present invention relates to semiconductor devices and fabrication methods thereof, and more particularly to wirings for semiconductor devices composed of multi-layer type (laminated films) of an Al-Si-Cu alloy film and a refractory metal (having high melting point) silicide film and fabrication methods thereof.

2. Description of the Prior Art

Aluminum-based alloy films have been used widely for a long time as wiring materials of semiconductor devices. In the old days, aluminum films alone had been used. As the depth of diffused layers became small, Al-Si alloy films began to be employed in order to deal with the so-called alloy spike phenomenon. With the patterns of the semiconductor devices becoming finer, the current density for wirings increased first, and the electromigration became an important problem in reliability. This phenomenon is accompanied with Si precipitation, micro-void growth and the like which could not be handled by means of the Al-Si alloy films. This is the reason why Al-Si-Cu alloy films became to be introduced. Use of these alloy films cause $CuAl_2$ to be precipitated at the grain boundaries, and $CuAl_2$ thus formed blocks the mass transport of Al by the current. In addition, as the wiring width approaches the grain size due to the patterns of the semiconductor devices becoming finer, the stressmigration phenomenon was made visible. Under the circumstances, that the Al-Si-Cu alloy films are powerless against the stressmigration failure, laminated films consisting of an Al-Si-Cu alloy film and an refractory metal silicide film began to be introduced.

This laminated film is undoubtedly effective for stressmigration failure. However, this laminated film is inferior to the Al-Si-Cu alloy in electromigration resistance.

This fact was reported by an article titled "COMPARISON OF ELECTROMIGRATION PHENOMENON BETWEEN ALUMINUM INTERCONNECTION OF VARIOUS MULTILAYERED MATERIALS" by T. Fujii et al. in the digest of papers for the 1989 VMIC Conference sponsored by IEEE, pp. 477–483. This report gives an analysis which focuses attention on the behavior of Si.

BRIEF SUMMARY OF THE INVENTION

Object of the Invention

It is an object of the present invention to provide wiring for semiconductor devices.

It is another object of the present invention to provide a highly reliable wiring for semiconductor devices.

It is a further object of the present invention to provide wiring for semiconductor devices which is excellent in electromigration resistance as well as in stressmigration resistance.

It is a further object of the present invention to provide wiring for semiconductor devices consisting of a laminated film of an Al-Si-Cu alloy film and a refractory metal silicide film.

It is a further object of the present invention to provide a highly reliable wiring for semiconductor devices consisting of a laminated film of an Al-Si-Cu alloy film and a refractory metal silicide film.

It is a further object of the present invention to provide wiring for semiconductor devices consisting of an Al-Si-Cu alloy film and a refractory metal silicide film which is excellent in the electromigration resistance as well as in the stressmigration resistance.

It is a further object of the present invention to provide a manufacturing method of a wiring for semiconductor devices.

It is a further object of the present invention to provide a manufacturing method of a highly reliable wiring for semiconductor devices.

It is a further object of the present invention to provide a manufacturing method of a wiring for semiconductor devices with excellent electromigration resistance as well as stressmigration resistance.

It is a further object of the present invention to provide a manufacturing method of a wiring for semiconductor devices consisting of a laminated film of an Al-Si-Cu alloy film and a refractory metal silicide film.

It is a further object of the present invention to provide a manufacturing method of a highly reliable wiring for semiconductor devices consisting of a laminated film of an Al-Si-Cu film and a refractory metal silicide film.

It is a further object of the present invention to provide a manufacturing method of a wiring for semiconductor devices consisting of a laminated film of an Al-Si-Cu alloy film and a refractory metal silicide film with excellent electromigration resistance as well as stressmigration resistance.

SUMMARY OF THE INVENTION

In a semiconductor device having a wiring consisting of an Al-Si-Cu alloy film and a refractory metal silicide film, the semiconductor device of the present invention has Cu added in the refractory metal silicide film. It is preferable that the refractory metal silicide film is a tungsten silicide film, a molybdenum silicide film. a tantalum silicide film or a titanium silicide film. When the refractory metal silicide film is a tungsten silicide film, the Cu concentration is preferable to be in the range of 0.1 to 1.0 wt. %. A wiring consisting of a laminated film of an Al-Si-Cu alloy film and a refractory metal silicide film with excellent stress-migration resistance can be obtained by adding Cu to the refractory metal silicide film without deteriorating its electromigration resistance. The reasons for the limitations on the Cu concentration when the refractory metal silicide film is a tungsten silicide film are as follows. When the Cu concentration is below 0.1 wt. %, the time median to failure (MTF) of electromigration is approximately equal to that of the case where Cu is not added to the tungsten silicide film. As the Cu concentration becomes higher than 0.1 wt. % the value of MTF increases rapidly. On the other hand, when the Cu concentration is higher than 1.0 wt. %, if an etching is given for forming wires of a laminated film consisting of an Al-Si-Cu alloy film and a tungsten silicide film with added Cu, and the wires are left standing, a corrosion is generated between Cu and Al caused by a local battery effect. However, for the Cu concentration below 1.0 wt. % there will not be generated a corrosion even if the sample is left alone for a long time.

In a method of manufacturing a semiconductor device having wires formed of a laminated film of an Al-Si-Cu alloy film and a refractory metal silicide film, a first aspect of the present invention includes the following steps. On one surface of a semiconductor substrate with a prescribed semiconductor elements formed thereon, there is deposited an insulating film and a prescribed contact hole is opened in thus insulating film to reach the semiconductor element. Then, a laminated film consisting of an Al-Si-Cu alloy film and a refractory metal silicide-Cu alloy film is formed all over the surface. Following that, the laminated film is etched by using a photoresist film as a mask. After removing the photoresist film, there is formed, by annealing, a laminated wiring consisting of the Al-Si-Cu alloy film and the refractory metal silicide-Cu alloy film. The refractory metal silicide-Cu alloy film is preferable that it is a tungsten silicide-Cu alloy film, a molybdenum silicide-Cu alloy film, a tantalum silicide-Cu alloy film or a titanium silicide-Cu alloy film. When the refractory metal silicide-Cu alloy film is a tungsten silicide-Cu alloy film, preferable Cu concentration of this film is in the range of 0.1 to 1.0 wt. %. The reasons for the limitation on the Cu concentration when the refractory metal silicide-Cu alloy film is a tungsten silicide-Cu alloy film are the same as aforementioned.

In a method of manufacturing a semiconductor device with a wiring consisting of a laminated film of an Al-Si-Cu alloy film and a refractory metal silicide film, a second aspect of the present invention includes the following steps. On one surface of a semiconductor substrate with a prescribed semiconductor element formed thereon, there is formed an insulating film, and a prescribed contact hole is opened in the insulating film to reach the semiconductor element. A laminated film consisting of an Al-Si-Cu alloy film and a refractory metal silicide-Cu Alloy film is formed all over the surface. The Cu concentration of the Al-Si-Cu alloy film is smaller than the Cu concentration of the refractory metal silicide-Cu alloy film. Then, the laminated film is etched by using a photoresist film as a mask. After removing the photoresist film, there is formed, by annealing, a laminated wiring consisting of a laminated film formed by the Al-Si-Cu alloy film and the refractory metal silicide-Cu alloy film. It is preferable that the refractory metal silicide-Cu alloy film is a tungsten silicide-Cu alloy film, a molybdenum silicide-Cu alloy film, a tantalum silicide-Cu alloy film or a titanium silicide-Cu alloy film. When the refractory metal silicide-Cu alloy film is a tungsten silicide-Cu alloy film, preferable Cu concentration of this film is in the range of 0.1 to 1.0 wt. %. The reasons for the limitation on the Cu concentration when the refractory metal silicide-Cu alloy film is a tungsten silicide-Cu alloy film is the same as aforementioned.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIGS. 1A and 1B are diagrams for elucidating the cause of deterioration in the electromigration resistance in the conventional laminated wiring consisting of a laminated film of an Al-Si-Cu alloy film and a refractory metal silicide film, in which

DETAILED DESCRIPTION OF THE PREFERRED EMBODIMENTS

Before proceeding to the description of the embodiments of the present invention, the history which led to the present invention is in order.

As described in the above, the electromigration resistance of a laminated film formed by an Al-Si-Cu alloy film and a refractory metal silicide film is inferior to that of a single layer film consisting exclusively of an Al-Si-Cu alloy film. The present inventor pursued the cause of the above-mentioned phenomenon from a view-point which is different from that reported by T. Fujii et al. in the digest of papers for the 1989 VMIC Conference, pp. 477–483.

Figure 1A:
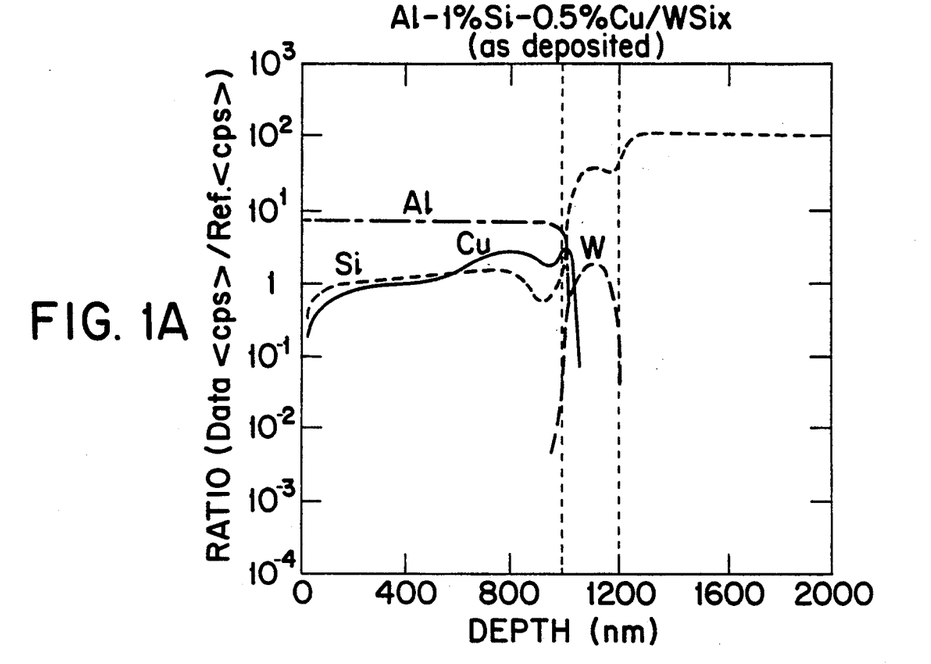
FIG. 1A is a graph showing the depth profile obtained by SIMS of a laminated film of an Al-Si-Cu film and a refractory metal silicide film as deposited.
Figure 1B:
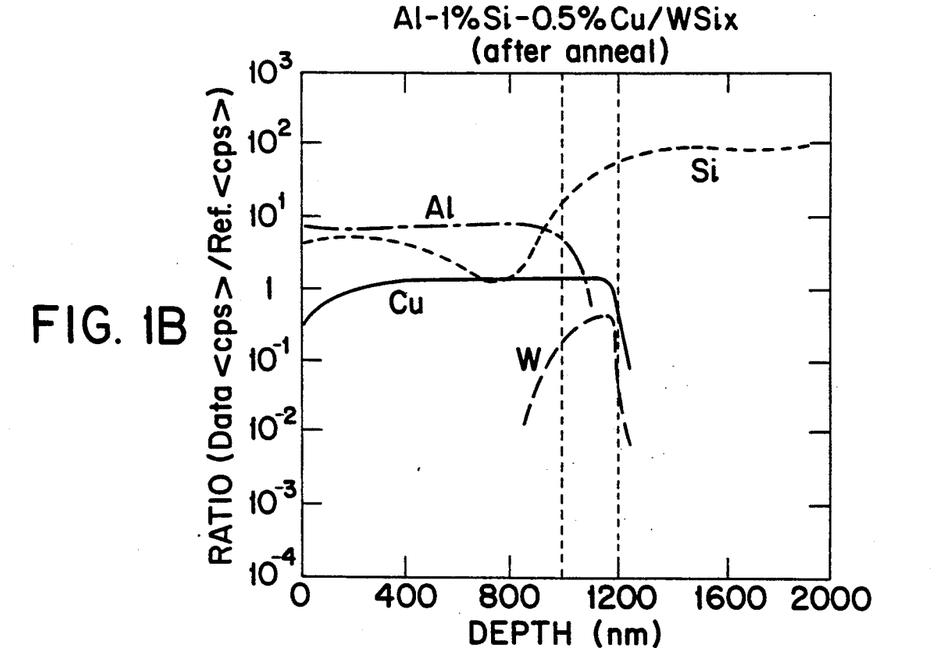
FIG. 1B is a graph showing the depth profile obtained by SIMS of a laminated film of an Al-Si-Cu film and a refractory metal silicide film after annealing.

Namely, after forming a silicon oxide film on a silicon substrate, a $WSi_x$ ($x=2.5-3.0$) film with thickness of 0.2 $\mu m$ is deposited, and further an Al-1% Si-0.5% Cu film with thickness of 1.0 $\mu m$ is deposited on top of it (% signifies wt. % hereinafter). The depth profile of the films as deposited determined by the SIMS measurement is shown in FIG. 1A. Then, the sample is annealed for 30 minutes at 450° C. in an atmosphere of the mixed gas of $H_2$ and $N_2$. The depth profile of the sample after annealing determined by the SIMS measurement is as shown in FIG. 1B. An oxygen beam is used for etching the sample in this measurement. The ordinate shows the ratio of the counts per second of each ion to the counts per second of oxygen used as the reference. What is of importance here are the relative changes in each of the ions and the reference. Suppose that one pays attention to Cu. In the as deposited state, Cu exists exclusively in the Al-Si-Cu film. However, following an annealing Cu is distributed substantially uniformly in the Al-Si-Cu film and the $WSi_x$ film. This is accomplished by the diffusion of Cu from the Al-Si-Cu film to the $WSi_x$ film.

Of the diffusing Cu ions it is considered that those from CuAl$_2$ in the grain boundaries dominate over those from the grains in the Al-Si-Cu film. Because of this, it is considered that the CuAl$_2$ concentration in the grain boundaries is lowered as a result of annealing, and the mass transport blocking power of Al in electromigration is reduced.

Based on the findings in the above, the present inventor proposed the following as the methods of suppressing the reduction in the electromigration resistance of the laminated film of the Al-Si-Cu film and the refractory metal silicide film. A first method is to keep the Cu concentration in the Al-Si-Cu alloy film high in advance. A second method is to add Cu to the refractory metal silicide film in advance. Further, a third method is to set the concentration of Cu to be added in advance to the refractory metal silicide film to be higher than the Cu concentration in the Al-Si-Cu film so as to generate a Cu diffusion from the side of the refractory metal silicide film to the side of the Al-Si-Cu alloy film. It is thought that an extreme example of this case is the method of converting by annealing the Al-Si alloy film of a laminated film of an Al-Si alloy film and a refractory metal silicide film with added Cu to an Al-Si-Cu alloy film.

The first method brings about an inconvenience in the etching of the Al-Si-Cu alloy film so that it was not tried.

Next, referring to the drawings, the present invention will be described.

Figure 2A:
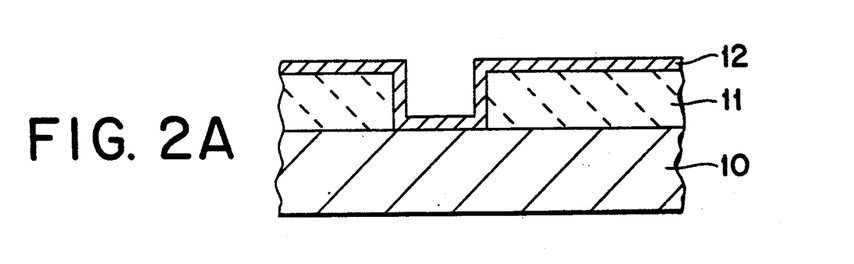
FIGS. 2A to 2C are schematic sectional views for describing the method of manufacturing a first embodiment of the present invention, arranged in the order of manufacturing steps.
Figure 2B:
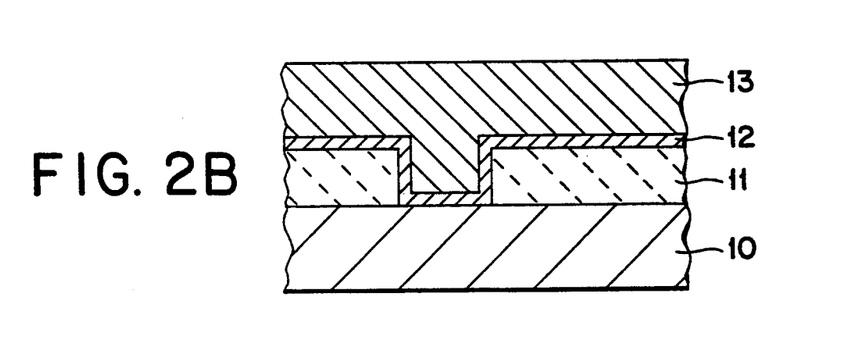
Figure 2C:
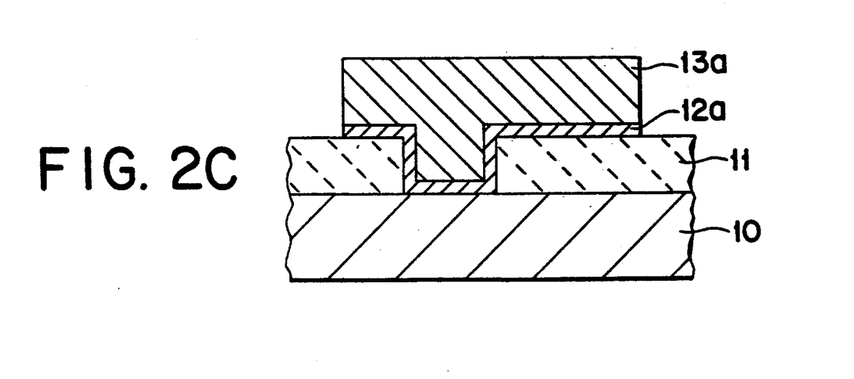

FIGS. 2A to 2C are schematic sectional views as arranged in the order of manufacturing steps for describing the first embodiment of the present invention.

First, as shown in FIG. 2A, a silicon oxide film 11 is formed on the surface of a silicon substrate 10 with a semiconductor element formed thereon (not shown), and a contact hole that reaches a required part of the semiconductor element is opened in the silicon oxide film 11. Next, a WSi$_x$-Cu alloy film 12 (x=2.5-3.0) obtained by adding 0.1-1.0 wt. % of Cu to a WSi$_x$ is deposited by sputtering on the entire surface to a thickness of 20-200 nm.

Then, as shown in FIG. 2B, an Al-Si-Cu alloy film 13 with thickness of 0.3-2.0 μm is deposited on top of it by sputtering. The Si concentration in the Al-Si-Cu alloy film 13 is 1.0 wt. %, and the Cu concentration is in the range of 0.3-1.0 wt. %.

Next, as shown in FIG. 2C, the Al-Si-Cu alloy film 13 and the WSi$_x$-Cu alloy film 12 are etched sequentially using a photoresist film (not shown) having the same shape as the wiring in a mask, thereby forming a laminated film having the same shape as the wiring. The etching method adopted is that of RIE that uses a mixed gas of Cl$_2$ and BCl$_3$ (CF$_4$ may be added). Subsequently, after removing the photoresist film the sample is annealed for 30 minutes in an atmosphere of mixed gas of H$_2$ and N$_2$. As a result, there is formed a laminated wiring consisting of the Al-Si-Cu alloy film 13a and the WSi$_x$-Cu alloy film 12a.

Figure 3A:
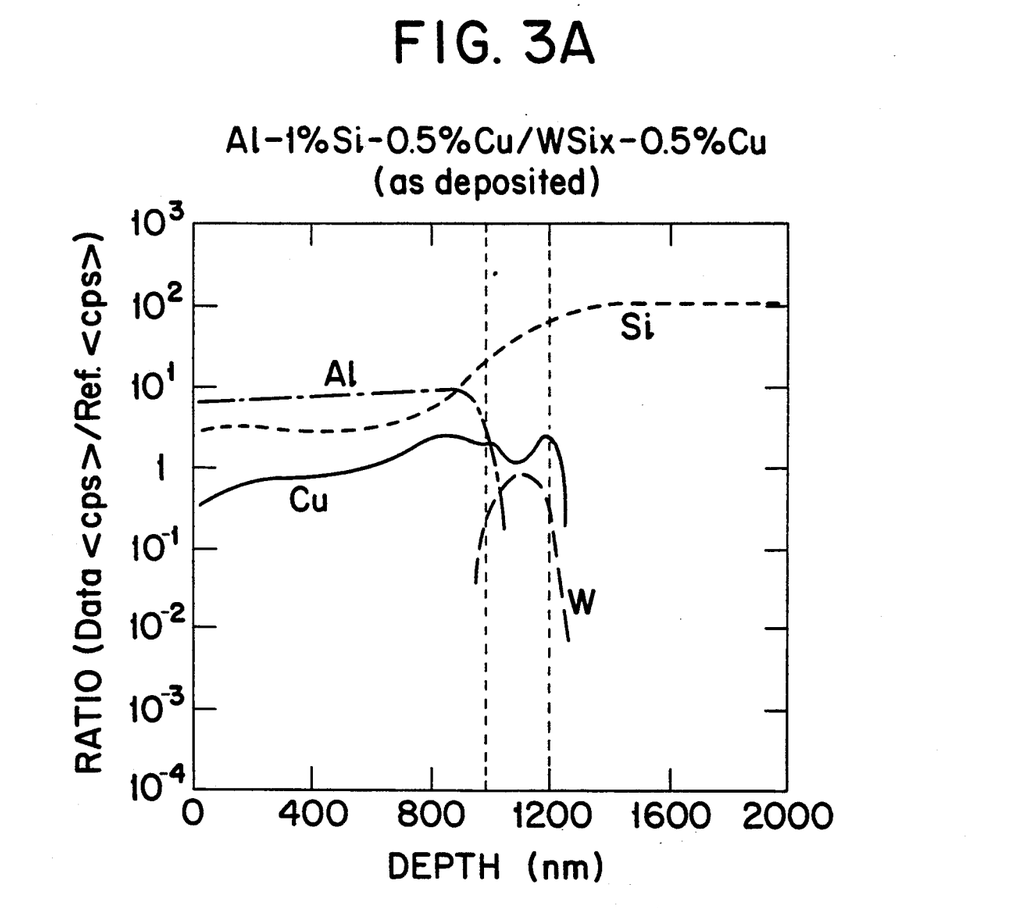
FIG. 3A is a graph showing the depth profile obtained by SIMS of a laminated film as deposited of an Al-Si-Cu alloy film and a tungsten silicide-Cu alloy film in a first embodiment of the present invention. Further.
Figure 3B:
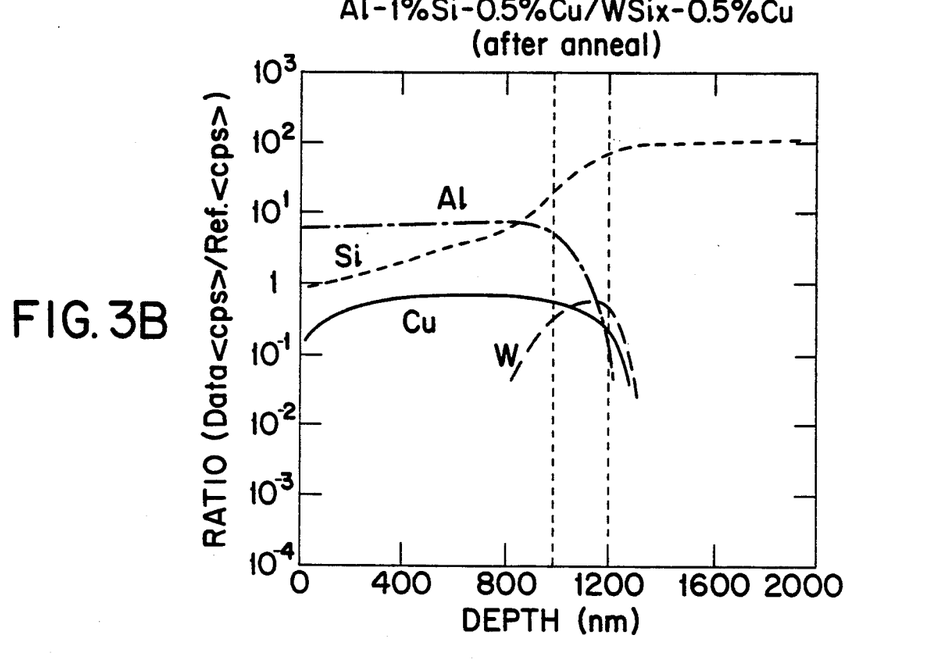
FIG. 3B is a graph showing the depth profile obtained by SIMS of the laminated film after annealing of the Al-Si-Cu alloy film and the tungsten silicide-Cu alloy film.

FIGS. 3A and 3B show the depth profiles of the laminated wiring of the present embodiment. The thickness of the Al-Si-Cu alloy film is 1 μm, and the concentrations of Si and Cu in the Al-Si-Cu alloy film are 1.0 wt. % and 0.5 wt. %, respectively. In addition, the thickness of the WSi$_x$-Cu alloy film is 0.2 μm, and the Cu concentration in the WSi$_x$-Cu alloy film is 0.5 wt. %. As shown in FIG. 3A, the Cu concentration in the state of as deposited is approximately uniform within the laminated film although there exist certain variations. Further, as shown in FIG. 3B, the Cu concentration is substantially uniform within the laminated film in the state of after annealing.

Figure 4A:
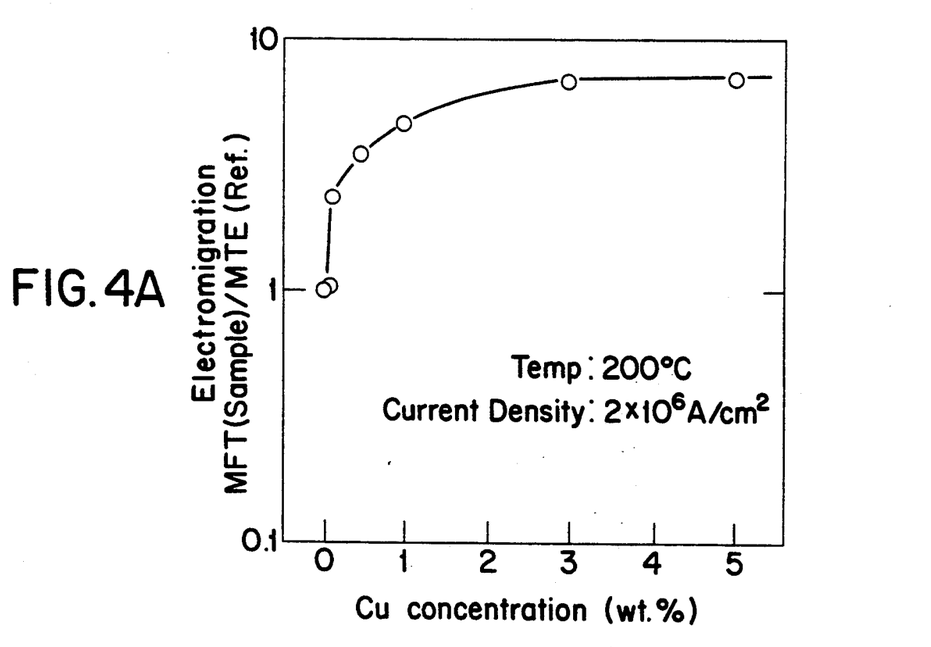
FIG. 4A is a graph showing the MTF value in normalized form for the electromigration resistance of the laminated film of the Al-Si-Cu alloy film and the tungsten silicide-Cu alloy film of the first embodiment of the present invention.
Figure 4B:
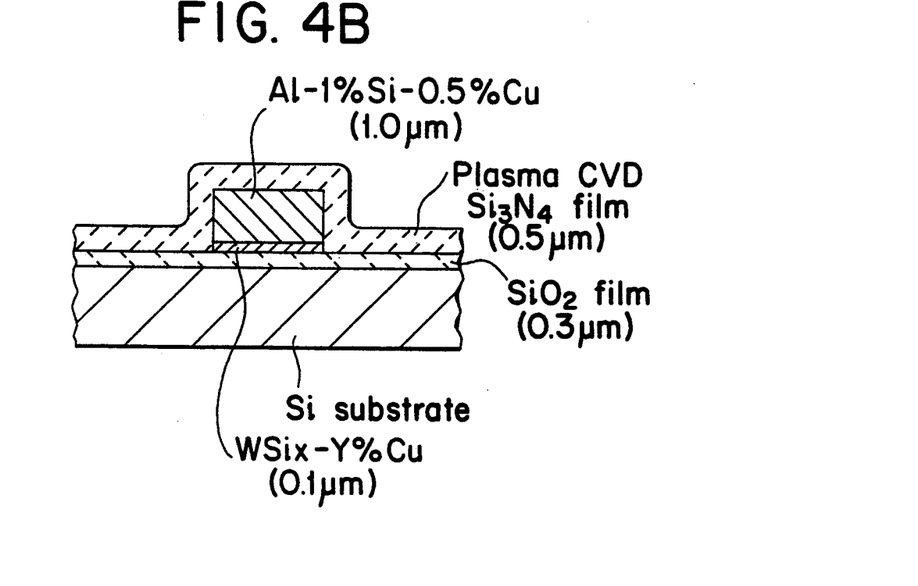
FIG. 4B is a schematic sectional view of the sample for the measurement in FIG. 4A.

Referring to FIGS. 4A and 4B, a description will be given concerning the electromigration resistance of the laminated wiring formed in the present embodiment. FIG. 4B is a schematic view of the sample used for the measurement of the electromigration resistance. The sample for the measurement is constructed as follows. A silicon oxide film with thickness of 0.3 μm is formed on a silicon substrate, and a WSi$_x$-Cu alloy film with thickness of 0.1 μm is formed thereon. The Cu concentration in the WSi$_x$-Cu alloy film is y wt. % (y=0-5). Following that, an Al-Si-Cu alloy film with thickness of 1.0 μm is formed on top of it. The Si and Cu concentrations within the Al-Si-Cu alloy film are 1.0 wt. % and 0.5 wt. %, respectively. A laminated wiring is formed by etching and annealing the laminated film. Further, a silicon nitride film with thickness of 0.5 μm is formed on top of it by plasma CVD method. FIG. 4A shows the measurement result of MTF wherein one half of the wires are disconnected due to electromigration under the conditions of a temperature of 200° C. and a current density of $2 \times 10^6$ A/cm$^2$. In the figure, the ordinate is the value of the MTF of the laminated wiring consisting of a WSi$_x$-Cu alloy film and a Al-Si-Cu alloy film normalized with respect to the MTF of a laminated wiring consisting of a WSi$_x$ film and an Al-Si-Cu alloy film. The abscissa shows the Cu concentration in the WSi$_x$-Cu alloy film. From the figure the following can be observed. That is, although the MTF is hardly improved for the Cu concentration of 0.06 wt. % in the WSi$_x$-Cu alloy film, the electromigration resistance is improved when the Cu concentration becomes over 1.0 wt. %.

Figure 5:
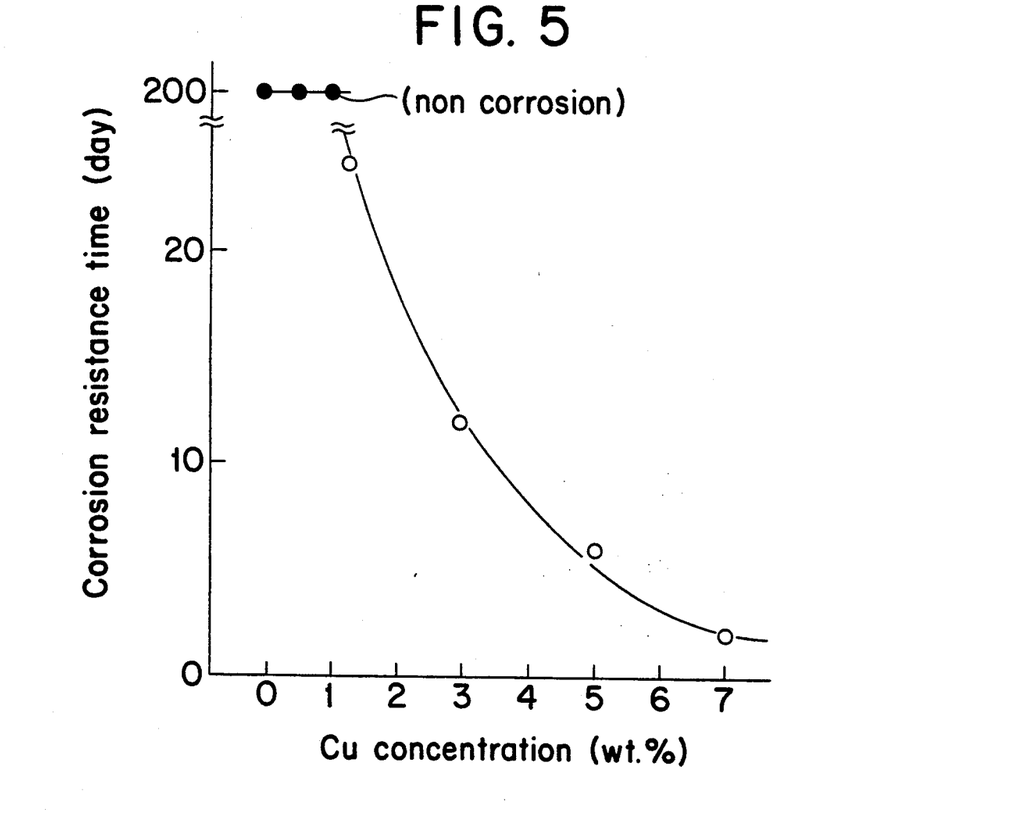
FIG. 5 is a graph showing the corrosion resistance time of a sample obtained by etching the laminated film of the Al-Si-Cu alloy film and the tungsten silicide alloy film of the first embodiment of the present invention, as a function of the Cu concentration in the tungsten silicide-Cu alloy film.

FIG. 5 is a graph showing the corrosion resistance time of the laminated wiring versus the Cu concentration in the WSi$_x$-Cu alloy film of the present embodiment. Here, the corrosion resistance time is defined as the duration (number of days) between the time at which the laminated film formed on the silicon substrate is left standing in the atmosphere after it is etched with the photoresist as a mask and the time when a corrosion is first observed. The corrosion is conjectured to be formed due to a local battery effect between Al in the Al-Si-Cu alloy film and Cu in the WSi$_x$-Cu alloy film. From the figure it can be observed for the Cu concentration in the WSi$_x$-Cu alloy film higher than 1.0 wt. % that the corrosion resistance time is reduced with the increase in the Cu concentration. For example, the corrosion resistance time is 24 days for the Cu concentration of 1.2 wt. %. In contrast, when the Cu concentration in the WSi$_x$-Cu alloy film is below 1.0 wt. %, no corrosion is observed even if the laminated film is left alone for about 200 days. A corrosion resistance time of about 24 days will be of no special problem from the production viewpoint, but it will become of a serious concern from the reliability view point. In this case the moisture resistance of the semiconductor device will be reduced. Accordingly, preferable Cu concentration in the WSi$_x$-Cu alloy film is below 1.0 wt. %.

As has been described in the above, in the present embodiment the deterioration in the electromigration resistance can be suppressed while holding the stress-migration resistance if the Cu concentration in the WSi$_x$-Cu alloy film is set to the range of 0.1 to 1.0 wt. %.

In the present embodiment, the description has been presented in terms of a laminated wiring consisting of an upper layer of an Al-Si-Cu alloy film and a lower layer of a WSi$_x$-Cu alloy film. However, an effect similar to that of the present embodiment can be obtained for a laminated film, for example, consisting of an upper layer, an intermediate layer and a lower layer of a WSi$_x$-Cu alloy film, an Al-Si-Cu alloy film and a WSi$_x$-Cu alloy film, respectively. Similarly, it will be obvious that an effect similar to that of the present embodiment can also be obtained for laminated films using other combinations of the two kinds of the alloy films, such as a laminated film with an Al-Si-Cu alloy film for the upper and the lower layers and a WSi$_x$-Cu alloy film for the intermediate layer.

It should also be mentioned that the present embodiment has been described in conjunction with a WSi$_x$-Cu alloy film. However, apart from the numerical limitations on the actual values, it is also possible to suppress the deterioration of the electromigration resistance, while maintaining the stressmigration resistance of wires consisting of a laminated film of an Al-Si-Cu alloy film and a refractory metal silicide film by adopting a molybdenum silicide film, tantalum silicide film or a titanium silicide film as the refractory metal silicide film and adding Cu to such a film.

FIGS. 6A to 6D are schematic sectional views arranged in the order of manufacturing steps of a second embodiment of the present invention. This embodiment is an example extreme case wherein the concentration of Cu to be added in advance to a refractory metal silicide is made higher than the Cu concentration in an Al-Si-Cu alloy film so as to generate a diffusion of Cu from the side of the refractory metal silicide to the side of the Al-Si-Cu alloy film. In other words, in the present embodiment the Al-Si alloy film is converted to an Al-Si-Cu film by annealing the laminated film of the Al-Si alloy film and the refractory metal silicide film to which is added Cu.

Figure 6A:
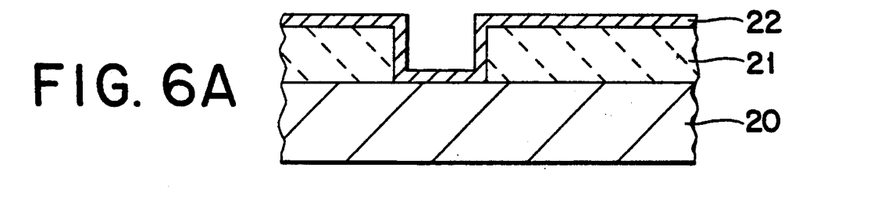
FIGS. 6A to 6D are sectional views for describing the method of manufacturing a second embodiment of the present invention as arranged in the order of manufacturing steps.

First, as shown in FIG. 6A, a silicon oxide film 21 is formed on the surface of a silicon substrate 20 with a semiconductor element (not shown) formed thereon, and a contact hole reaching a required part of the semiconductor element is opened in the silicon oxide film 21. Next, a WSi$_x$-Cu alloy film 22 obtained by adding 0.9 wt. % of Cu to a WSi$_x$ (x=2.5-3.0) is deposited by sputtering on the entire surface to a thickness of 0.2 μm.

Figure 6B:
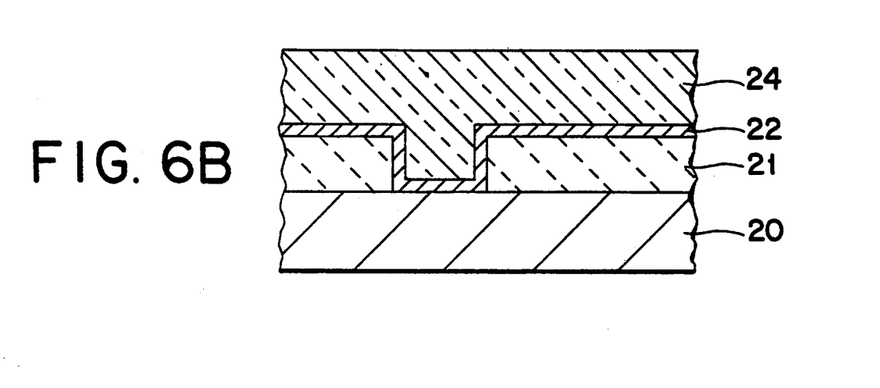

Next, as shown in FIG. 6B, an Al-Si alloy film 24 with thickness of 1 μm is deposited on top of it by sputtering. The Cu concentration in the Al-Si alloy film 24 is 1.0 wt. %.

Figure 6C:
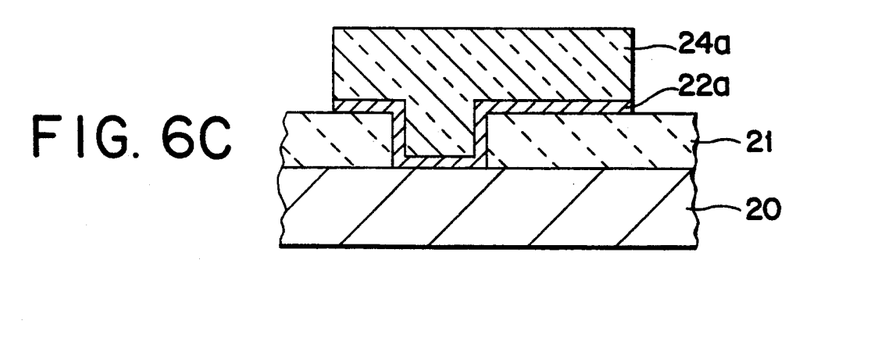

Then, as shown in FIG. 6C, the Al-Si alloy film 24 and the WSi$_x$-Cu alloy film 22 are etched sequentially by using a photoresist film (not shown) having the same shape as the wiring in a mask, and a laminated film consisting of an Al-Si alloy film 24a and a WSi$_x$-Cu alloy film 22a with the same shape as the wiring is formed. The etching method adopted is that of an RIE which uses a mixed gas of Cl$_2$ and BCl$_3$ (CF$_4$ may also be added).

Figure 6D:
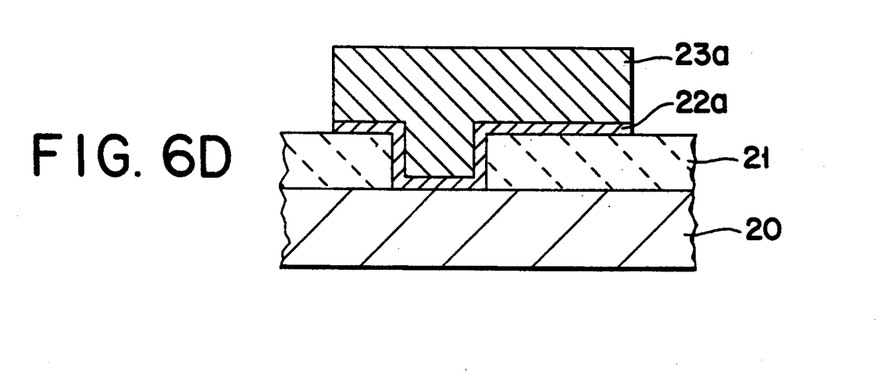

Then, as shown in FIG. 6D, after removing the photoresist film, an annealing is given for 30 minutes at 450° C. in the atmosphere of a mixed gas of H$_2$ and N$_2$. As a result, the Al-Si alloy film 24a is converted to an Al-Si-Cu alloy film 23a, and a laminated wiring consisting of the Al-Si-Cu alloy film 23a and the WSi-Cu alloy film 22a is formed. The Cu concentration in the Al-Si-Cu alloy film formed by converting the Al-Si alloy film is 0.12 to 0.15 wt. %.

In the present embodiment, analogous to the case of the first embodiment, it is also possible to suppress the deterioration of the electromigration resistance while maintaining the stressmigration resistance.

Although the invention has been described with reference to specific embodiments, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

I claim:

1. A method of manufacturing a laminated wiring for a semiconductor device in which the laminated wiring, formed on an insulating layer on a semiconductor substrate and comprising an aluminum-silicon-copper alloy film and a refractory metal silicide-copper alloy film, is in contact with a portion of a major surface of said semiconductor substrate through at least one contact hole formed in said insulating layer, said method comprising the steps of:

forming the insulating film having at least one contact hole on a major surface of said semiconductor substrate;

forming a laminated film including a first alloy layer including aluminum, silicon, and copper and a second alloy layer including silicon, copper, and a refractory metal selected from the group consisting of tungsten, molybdenum, tantalum and titanium on said insulating layer and said portion of the major surface;

selectively etching said laminated film to form a laminated pattern; and thereafter annealing said laminated pattern thereby converting said pattern to said laminated wiring.

2. A method of manufacturing as claimed in claim 1, wherein said refractory metal silicide-copper alloy film is a tungsten silicide-copper alloy film and the concentration of the copper in said tungsten silicide-copper alloy film is in the range of 0.1 to 1.0 weight percent.

3. A method of manufacturing as claimed in claim 1, wherein the concentration of copper in said refractory metal silicide-copper alloy film is higher than the concentration of copper in said aluminum-silicon copper alloy film.

4. A method of manufacturing as claimed in claim 3, wherein said refractory metal silicide-copper alloy film is a tungsten silicide-copper alloy film and the concentration of copper in said tungsten silicide-copper alloy film is in the range of 0.1 to 1.0 weight percent.

* * * * *

UNITED STATES PATENT AND TRADEMARK OFFICE
CERTIFICATE OF CORRECTION

PATENT NO. : 5,238,874
DATED : August 24, 1993
INVENTOR(S) : Yoshiaki Yamada

It is certified that error appears in the above-indentified patent and that said Letters Patent is hereby corrected as shown below:

On the Title page, item [54] in the Title, delete "AL-SI-Co" and insert-- AL-SI-CU --.

Signed and Sealed this

Fifteenth Day of March, 1994

Attest:

BRUCE LEHMAN

Attesting Officer        Commissioner of Patents and Trademarks